(12) United States Patent
Ogami et al.

(10) Patent No.: US 10,618,113 B2
(45) Date of Patent: Apr. 14, 2020

(54) SURFACE-COATED CUTTING TOOL

(71) Applicant: MITSUBISHI MATERIALS CORPORATION, Tokyo (JP)

(72) Inventors: Tsuyoshi Ogami, Naka (JP); Tatsuo Hashimoto, Akashi (JP); Natsuki Ichimiya, Kobe (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 168 days.

(21) Appl. No.: 15/771,254

(22) PCT Filed: Oct. 27, 2016

(86) PCT No.: PCT/JP2016/081852
§ 371 (c)(1),
(2) Date: Apr. 26, 2018

(87) PCT Pub. No.: WO2017/073653
PCT Pub. Date: May 4, 2017

(65) Prior Publication Data
US 2018/0326501 A1  Nov. 15, 2018

(30) Foreign Application Priority Data

Oct. 28, 2015 (JP) .................. 2015-211484
Oct. 26, 2016 (JP) .................. 2016-209195

(51) Int. Cl.
*B23B 27/14* (2006.01)
*C23C 28/04* (2006.01)
(Continued)

(52) U.S. Cl.
CPC ............ *B23B 27/14* (2013.01); *B23B 51/00* (2013.01); *B23C 5/16* (2013.01); *C23C 14/0641* (2013.01);
(Continued)

(58) Field of Classification Search
USPC .......... 51/307, 309; 428/216, 336, 697, 698, 428/699
See application file for complete search history.

(56) References Cited

U.S. PATENT DOCUMENTS

2008/0075976 A1*  3/2008  Yamamoto ............ C23C 30/005
428/704
2009/0011257 A1*  1/2009  Vetter .................... C22C 21/00
428/697
(Continued)

FOREIGN PATENT DOCUMENTS

CN  101468401 A  7/2009
CN  102465257 A  5/2012
(Continued)

OTHER PUBLICATIONS

International Search Report dated Jan. 24, 2017 for the corresponding PCT International Patent Application No. PCT/JP2016/081852.
(Continued)

*Primary Examiner* — Archene A Turner
(74) *Attorney, Agent, or Firm* — Leason Ellis LLP

(57) ABSTRACT

A surface-coated cutting tool includes a tool body and a hard coating layer including a lower layer and an upper layer. The lower layer is made of a complex nitride layer of Al, Ti, and Si with the thickness of 0.3 to 3.0 μm. It satisfies $0.3 \leq \alpha \leq 0.5$ and $0.01 \leq \beta \leq 0.10$ (atomic ratio) being expressed by $(Al_{1-\alpha-\beta}Ti_\alpha Si_\beta)N$. The upper layer is made of a complex nitride layer of Al, Cr, Si, and Cu with the thickness of 0.5 to 5.0 μm. It satisfies $0.15 \leq a \leq 0.40$, $0.05 \leq b \leq 0.20$, and $0.005 \leq c \leq 0.05$ (atomic ratio) being expressed by $(Al_{1-a-b-c}Cr_a Si_b Cu_c)N$. The upper layer is made of crystals having a hexagonal structure, and a half width of a diffraction peak of a (110) plane present in a range of $2\theta=55°$ to $65°$ is $1.0°$ to $3.5°$.

8 Claims, 2 Drawing Sheets

(51) Int. Cl.
    *C23C 28/00* (2006.01)
    *C23C 14/32* (2006.01)
    *B23B 51/00* (2006.01)
    *B23C 5/16* (2006.01)
    *C23C 14/06* (2006.01)
    *C23C 16/34* (2006.01)
    *C23C 14/50* (2006.01)
    *C23C 14/00* (2006.01)

(52) U.S. Cl.
    CPC ............ *C23C 14/325* (2013.01); *C23C 16/34* (2013.01); *C23C 28/042* (2013.01); *C23C 28/044* (2013.01); *C23C 28/42* (2013.01); *B23B 2228/105* (2013.01); *C23C 14/0021* (2013.01); *C23C 14/505* (2013.01)

(56) References Cited

U.S. PATENT DOCUMENTS

| | | | | |
|---|---|---|---|---|
| 2009/0130465 | A1* | 5/2009 | Vetter | C23C 14/06 428/446 |
| 2011/0183131 | A1* | 7/2011 | Maeda | B23F 21/00 428/216 |

FOREIGN PATENT DOCUMENTS

| | | |
|---|---|---|
| CN | 102639268 A | 8/2012 |
| CN | 102686772 A | 9/2012 |
| CN | 103764323 A | 4/2014 |
| CN | 104789938 A | 7/2015 |
| EP | 0701982 A1 | 3/1996 |
| EP | 2177295 A1 | 4/2010 |
| JP | 2004-034186 A | 2/2004 |
| JP | 3781374 B | 5/2006 |
| JP | 2008-031517 A | 2/2008 |
| JP | 2008-073800 A | 4/2008 |
| JP | 2009-039838 A | 2/2009 |
| JP | 2010-059456 A | 3/2010 |
| JP | 2012-072500 A | 4/2012 |
| JP | 2012-081548 A | 4/2012 |
| WO | WO-2009/022557 A1 | 2/2009 |

OTHER PUBLICATIONS

Office Action dated Mar. 5, 2019 for the related Chinese Patent Application No. 201680062393.6.
European Search Report dated Mar. 14, 2019 for the corresponding European Patent Application No. 16859882.9.

* cited by examiner

SURFACE-COATED CUTTING TOOL

CROSS-REFERENCE TO RELATED PATENT APPLICATIONS

This application is a U.S. National Phase Application under 35 U.S.C. § 371 of International Patent Application No. PCT/JP2016/081852 filed on Oct. 27, 2016 and claims the benefit of Japanese Patent Applications No. 2015-211484, filed on Oct. 28, 2015, and No. 2016-209195, filed on Oct. 26, 2016, all of which are incorporated herein by reference in their entireties. The International Application was published in Japanese on May 4, 2017 as International Publication No. WO/2017/073653 under PCT Article 21(2).

FIELD OF THE INVENTION

The present invention relates to a surface-coated cutting tool (hereinafter, referred to as coated tool) in which peeling and the like of a hard coating layer do not occur during cutting work of a high hardness material like hardened steel, excellent chipping resistance and wear resistance are exhibited, and excellent cutting performance is exhibited for a long-term usage.

BACKGROUND OF THE INVENTION

In general, as coated tools, throw-away tips which are detachably attached to the tip end portion of an insert holder to be used for turning or planing a work material such as various kinds of steel and cast iron, drills or miniature drills used for drilling or the like of the work material, end mills used for facing, grooving, shoulder milling, and the like of the work material, solid hobs and pinion cutters used for gear cutting of the work material into tooth shapes, and the like are known.

In addition, various suggestions have hitherto been made for the purpose of improving the cutting performance of coated tools.

For example, as described in Japanese Patent No. 3781374, a coated tool is suggested in which the surface of a tool body made of tungsten carbide (hereinafter, referred to as WC)-based cemented carbide, titanium carbonitride (hereinafter, referred to as TiCN)-based cermet, or the like is coated with one or more hard layers having a cubic structure composed of a metal component primarily containing Cr, Al, and Si and at least one element selected from C, N, O, and B such that the fracturing resistance and wear resistance are improved.

In addition, Japanese Unexamined Patent Application, First Publication No. 2004-34186 suggests a coated tool in which the surface of a tool body is coated with at least one layer of coating containing Si and B by containing, as metallic elements, elements selected from one or more of groups 4a, 5a, and 6a in the periodic table and Al and the element Si, and containing, as non-metallic elements, elements selected from one or more of N, C, O, and S and the element B, and the coating containing Si and B has a mixed phase of a crystalline phase and an amorphous phase, the minimum crystal grain size of crystal grains contained in the crystalline phase is set to be 0.5 nm or more and less than 20 nm, such that the toughness of the Si-containing wear-resistant coating is improved by suppressing embrittlement caused by excessive residual compressive stress without sacrificing the high hardness of the Si-containing wear-resistant coating. Furthermore, it is described that substitution of less than 10 at % of the coating components with Cu is effective in improving oxidation resistance.

In addition, Japanese Unexamined Patent Application, First Publication No. 2008-31517 describes a coated tool in which the surface of a tool body is coated with a hard coating layer, and at least one layer of hard coating is expressed by $(M_aL_b)X_c$ (here, M represents at least one metal element selected from Cr, Al, Ti, Hf, V, Zr, Ta, Mo, W and Y, L represents at least one additional element selected from Mn, Cu, Ni, Co, B, Si, and S, X represents at least one non-metallic element selected from C, N and O, a represents the atomic ratio of M to the sum of M and L, b represents the atomic ratio of L to the sum of M and L, c represents the atomic ratio of X to the sum of M and L, and a, b, and c each satisfy $0.85 \leq a \leq 0.99$, $0.01 \leq b \leq 0.15$, $a+b=1$, and $1.00 < c \leq 1.20$), whereby crystal grain refinement and crystal stability are achieved by Cu, Si, and the like which are the components of the hard coating, resulting in an increase in high-temperature hardness, an improvement in wear resistance, and furthermore, an improvement in oxidation resistance.

In addition, Japanese Unexamined Patent Application, First Publication No. 2008-73800 suggests a coated tool in which a hard coating having a composition $Al_{1-a-b-c}Si_aMg_b M_c(B_xC_yN_z)$ (here, M is at least one element selected from Nb, V, Zr, Cr, Ti, Cu, and Y, and a, b, c, x, y, and z satisfy $0 \leq a \leq 0.35$, $0 \leq b \leq 0.2$, $0.03 \leq a+b \leq 0.5$, and $0 \leq c \leq 0.1$ in atomic ratio, and $0.9 \leq Al+Si+Mg$, $0 \leq x \leq 0.2$, $0 \leq y \leq 0.4$, $0.5 \leq z \leq 1$, and $x+y+z=1$ are satisfied in atomic ratio) is formed on the surface of a tool body, thereby improving the hardness, oxidation resistance, toughness, and wear resistance of the hard coating. In addition, it is described that in a case where Cu is contained as a component of the hard coating, an increase in the hardness of the coating due to crystal grain refinement, and a lubricating action are expected.

Furthermore, Japanese Unexamined Patent Application, First Publication No. 2009-39838 suggests a coated tool in which a hard coating layer having at least an alternate laminated structure of a thin layer A and a thin layer B is formed on the surface of a tool body, the thin layer A is made of an (Al, Cr, Si)N layer which satisfies a composition formula $[Al_XCr_YSi_Z]N$ (in atomic ratio, $0.2 \leq X \leq 0.45$, $0.4 \leq Y \leq 0.75$, $0.01 \leq Z \leq 0.2$, and $X+Y+Z=1$), and the thin layer B is made of an (Al, Ti, Si)N layer which satisfies $[Al_U Ti_V Si_W]N$ (in atomic ratio, $0.05 \leq U \leq 0.75$, $0.15 \leq V \leq 0.94$, $0.01 \leq W \leq 0.1$, and $U+V+W=1$), such that the fracturing resistance and wear resistance during high-speed cutting work are improved.

Technical Problem

An improvement in performance of a cutting apparatus in recent years has been remarkable, and there has been a strong demand for power saving and energy saving during cutting work and a further reduction of cost. In accordance with this, there is a trend toward a further increase in speed and efficiency during cutting work. There is no particular problem in a case where the coated tool of the related art is used for cutting work of steel, cast iron, or the like under typical cutting conditions. However, in a case where this is used for cutting work during which high-temperature heat is generated and high impact and mechanical loads are exerted on a cutting edge, such as high-speed milling of a high hardness material like hardened steel, the occurrence of chipping, fracturing, peeling, and the like cannot be suppressed. Furthermore, wear progression is promoted. Therefore, in the current situation, the coated tool of the related art reaches the end of its service life within a relatively short period of time.

Therefore, from the above-described viewpoints, the inventors intensively conducted researches to develop a coated tool in which a hard coating layer exhibits excellent chipping resistance, fracturing resistance, peeling resistance, and wear resistance under cutting work conditions under which high-temperature heat is generated and high impact and mechanical loads are exerted on a cutting edge, such as high-speed milling of a high hardness material like hardened steel, while focusing on a layer forming material that forms the hard coating layer of the coated tool of the related art and the crystal structure thereof. As a result, the following knowledge was obtained.

In the coated tool of the related art described in Japanese Patent No. 3781374, the Al component of the (Al, Cr, Si)N layer forming the hard coating layer has an effect of improving high-temperature hardness, the Cr component has an effect of improving high-temperature toughness and high-temperature strength and improving high-temperature oxidation resistance in a state in which Al and Cr coexist with each other, and the Si component has an effect of improving heat-resistant plastic deformability. However, under cutting conditions under which high-temperature heat is generated and high impact and mechanical loads are exerted on a cutting edge, the occurrence of chipping, fracturing, and the like cannot be avoided, and for example, even when there is an attempt to improve the high-temperature toughness and high-temperature strength by increasing the Cr content ratio, the wear resistance decreases due to a relative reduction of the Al content ratio. Therefore, there is a limitation on the improvement in the chipping resistance and wear resistance of the hard coating layer formed of the (Al, Cr, Si)N layer.

In addition, in the coated tools of the related art described in Japanese Unexamined Patent Application, First Publication No. 2004-34186, Japanese Unexamined Patent Application, First Publication No. 2008-31517 and Japanese Unexamined Patent Application, First Publication No. 2008-73800, it is suggested that crystal grain refinement is achieved by including Cu as the component of the hard coating layer, thereby improving the wear resistance. However, while the wear resistance is improved, the toughness is decreased, so that the occurrence of chipping cannot be suppressed, and the tool life is still short.

Furthermore, in the coated tool of the related art described in Japanese Unexamined Patent Application, First Publication No. 2009-39838, although excellent chipping resistance and wear resistance are exhibited during typical cutting work of carbon steel, alloy steel, and the like, it cannot be said that sufficient chipping resistance and wear resistance are exhibited during cutting of a high hardness material like hardened steel for a long-term usage.

Here, the inventors found that an improvement in wear resistance by crystal grain refinement is achieved by including Cu as a component of a hard coating layer formed of an (Al, Cr, Si)N layer, the toughness of the hard coating layer is improved by causing the crystal structure of the hard coating layer to be a hexagonal structure, and furthermore, a lower layer for improving the adhesion strength between the hard coating layer and a tool body is provided or an intermediate layer is formed to be interposed between the lower layer and an upper layer to further increase the adhesion strength, whereby both excellent chipping resistance and excellent wear resistance can be achieved without the occurrence of peeling and the like even under cutting work conditions under which high-temperature heat is generated and high impact and mechanical loads are exerted on a cutting edge, such as high-speed milling of a high hardness material like hardened steel.

SUMMARY OF THE INVENTION

The present invention is made based on the above-described knowledge and has the following aspects.

(1) A surface-coated cutting tool including: a tool body made of any one selected from the group consisting of tungsten carbide-based cemented carbide, TiCN-based cermet, a cubic boron nitride sintered material, and high-speed tool steel; and a hard coating layer, which is provided on a surface of the tool body and includes at least a lower layer and an upper layer, wherein (a) the lower layer is made of a complex nitride layer of Al, Ti, and Si with an average layer thickness of 0.3 to 3.0 μm, and in a case where the lower layer is expressed by a composition formula: $(Al_{1-\alpha-\beta}Ti_\alpha Si_\beta)N$, the lower layer satisfies $0.3 \leq \alpha \leq 0.5$ and $0.01 \leq \beta \leq 0.10$ (here, each of $\alpha$ and $\beta$ is in atomic ratio), (b) the upper layer is made of a complex nitride layer of Al, Cr, Si, and Cu with an average layer thickness of 0.5 to 5.0 μm, and in a case where the upper layer is expressed by a composition formula: $(Al_{1-a-b-c}Cr_a Si_b Cu_c)N$, the upper layer satisfies $0.15 \leq a \leq 0.40$, $0.05 \leq b \leq 0.20$, and $0.005 \leq c \leq 0.05$ (here, each of a, b, and c is in atomic ratio), and (c) the upper layer is made of crystals having a hexagonal structure, and a half width of a diffraction peak of a (110) plane present in a range of 2θ=55° to 65° obtained by performing X-ray diffraction on the upper layer is 1.0° to 3.5°.

(2) The surface-coated cutting tool according to (1), wherein an intermediate layer which has an alternate laminated structure of a thin layer A and a thin layer B and has an average total layer thickness of 0.1 to 1.0 μm is formed to be interposed between the lower layer and the upper layer, (a) in a case where the thin layer A is expressed by a composition formula: $(Al_{1-a-b-c}Cr_a Si_b Cu_c)N$, the thin layer A satisfies $0.15 \leq a \leq 0.40$, $0.05 \leq b \leq 0.20$, $0.005 \leq c \leq 0.05$ (here, each of a, b, and c is in atomic ratio) and is made of a complex nitride layer of Al, Cr, Si, and Cu with an average single layer thickness of 0.005 to 0.10 μm, and (b) in a case where the thin layer B is expressed by a composition formula: $(Al_{1-\alpha-\beta}Ti_\alpha Si_\beta)N$, the thin layer B satisfies $0.30 \leq \alpha \leq 0.50$, $0.01 \leq \beta \leq 0.10$ (here, each of $\alpha$ and $\beta$ is in atomic ratio) and is made of a complex nitride layer of Al, Ti, and Si with an average single layer thickness of 0.005 to 0.10 μm.

(3) The surface-coated cutting tool according to (1) or (2), wherein the upper layer contains crystals of a cubic structure with crystals of the hexagonal structure in the layer.

(4) The surface-coated cutting tool according to any one of (1) to (3), wherein, when it is defined that a diffraction peak intensity of a cubic (200) plane of the upper layer is c(200) and a diffraction peak intensity of a hexagonal (110) plane of the upper layer is h(110), a peak intensity ratio satisfies c(200)/h(110)<1.

Next, a coated cutting tool according to an aspect of the present invention (hereinafter, referred to as "coated cutting tool of the present invention") will be described in detail.

FIG. 1A illustrates a schematic longitudinal sectional view of the coated cutting tool of the present invention and illustrates a form of the coated cutting tool of the present invention. FIG. 1B illustrates a schematic longitudinal sectional view of the coated cutting tool of the present invention and illustrates another form of the coated cutting tool of the present invention.

In FIG. 1A, the surface of a tool body made of tungsten carbide-based cemented carbide is coated with a complex nitride layer of Al, Ti, and Si (hereinafter, sometimes referred to as "(Al, Ti, Si)N layer") as a lower layer, and the lower layer is coated with a complex nitride layer of Al, Cr, Si, and Cu (hereinafter, sometimes referred to as "(Al, Cr, Si, Cu)N layer") as an upper layer.

In FIG. 1B, an intermediate layer having an alternate laminated structure of a thin layer A and a thin layer B is formed to be interposed between the lower layer and the upper layer shown in FIG. 1A, the thin layer A is made of an (Al, Cr, Si, Cu)N layer having the same component composition as that of the upper layer, and the thin layer B is made of an (Al, Ti, Si)N layer having the same component composition as that of the lower layer.

Composition of Complex Nitride Layer of Al, Ti, and Si Forming Lower Layer or Thin Layer B of Intermediate Layer:

In the composition formula of the complex nitride layer of Al, Ti, and Si (hereinafter, sometimes referred to as "(Al, Ti, Si)N layer") forming the lower layer or the thin layer B of the intermediate layer, the Al component and the Si component improve the wear resistance of the lower layer or the thin layer B of the intermediate layer, and the Ti component improves the high-temperature toughness and the high-temperature strength in the lower layer or the thin layer B of the intermediate layer.

Furthermore, since the (Al, Ti, Si)N layer has excellent adhesion strength between the tool body and the upper layer or the complex nitride layer of Al, Cr, Si, and Cu (hereinafter, sometimes referred to as "(Al, Cr, Si, Cu)N layer") as the thin layer A of the intermediate layer, in a case where high impact and mechanical loads are exerted during cutting work, the peeling resistance of the hard coating layer is increased.

However, in a case where the α value (atomic ratio) representing the Ti content ratio in the total amount of Al, Ti, and Si is less than 0.3, the effect of improving the high-temperature toughness and high-temperature strength cannot be expected, and in a case where the α value exceeds 0.5, due to a relative reduction of the content ratios of the Al component and the Si component, the minimum required high-temperature hardness and high-temperature oxidation resistance cannot be secured. In addition, when the β value (atomic ratio) representing the ratio of Si to the total amount of Al and Ti is less than 0.01, predetermined high-temperature hardness, high-temperature oxidation resistance, and heat-resistant plastic deformability, which are minimum required, cannot be secured, and this causes a reduction of wear resistance. When the β value exceeds 0.10, there is a trend toward a reduction of the effect of improving the wear resistance.

Therefore, the α value (atomic ratio) representing the Ti content ratio is set to $0.30 \leq \alpha \leq 0.50$, and the β value (atomic ratio) representing the Si content ratio is set to $0.01 \leq \beta \leq 0.10$.

Particularly desirable ranges of α and β mentioned above are $0.35 \leq \alpha \leq 0.42$ and $0.03 \leq \beta \leq 0.08$.

Composition of Complex Nitride Layer of Al, Cr, Si, and Cu Forming Upper Layer or Thin Layer A of Intermediate Layer:

In the (Al, Cr, Si, Cu)N layer forming the upper layer or the thin layer A of the intermediate layer, the Al component has an effect of improving high-temperature hardness, the Cr component has an effect of improving high-temperature toughness and high-temperature strength and improving high-temperature oxidation resistance in a state in which Al and Cr coexist with each other, the Si component has an effect of improving heat-resistant plastic deformability, and the Cu component has an effect of improving wear resistance by refining crystal grains.

However, when the a value (atomic ratio) representing the Cr content ratio in the total amount of Al, Cr, Si, and Cu in the (Al, Cr, Si, Cu)N layer is less than 0.15, the minimum required high-temperature toughness and high-temperature strength cannot be secured. Therefore, the occurrence of chipping and fracturing cannot be suppressed. When the a value exceeds 0.40, due to a relative reduction of the Al content ratio, wear progression is promoted. Therefore, the a value is set to 0.15 to 0.40. In addition, when the b value (atomic ratio) representing the Si content ratio in the total amount of Al, Cr, Si, and Cu is less than 0.05, the improvement in wear resistance due to the improvement in heat-resistant plastic deformability cannot be expected. When the b value exceeds 0.20, there is a trend toward a reduction of the effect of improving the wear resistance. Therefore, the b value is set to 0.05 to 0.20. Furthermore, when the c value (atomic ratio) representing the Cu content ratio in the total amount of Al, Cr, Si, and Cu is less than 0.005, a further improvement in wear resistance cannot be expected. When the c value exceeds 0.05, particles are likely to be generated when the (Al, Cr, Si, Cu)N layer is formed by an arc ion plating (hereinafter, referred to as "AIP") apparatus, and the chipping resistance decreases during cutting work during which high impact and mechanical loads are exerted. Therefore, the c value is set to 0.005 to 0.05.

Desirable ranges of a, b, and c are $0.15 \leq a \leq 0.25$, $0.05 \leq b \leq 0.15$, $0.01 \leq c \leq 0.03$.

Average Layer Thickness of Lower Layer:

When the upper layer formed of the (Al, Cr, Si, Cu)N layer is directly deposited on the surface of the tool body by physical vapor deposition, residual compressive stress is generated in the layer, and when this is used under severe cutting work conditions, the adhesion between the tool body and the upper layer becomes unstable due to the residual compressive stress. Here, it is necessary to further increase the adhesion strength between the surface of the tool body and the (Al, Cr, Si, Cu)N layer. Therefore, it is effective to increase the adhesion strength by forming the (Al, Ti, Si)N layer as the lower layer on the surface of the tool body.

When the layer thickness of the lower layer is less than 0.3 µm, the effect of improving adhesion is not obtained. When the layer thickness thereof exceeds 3.0 µm, cracks are likely to be generated due to the accumulation of the residual compressive stress, and stable adhesion cannot be secured. Therefore, the layer thickness of the lower layer is set to 0.3 to 3.0 µm, and desirably 0.5 to 2.0 µm.

Average Layer Thickness of Upper Layer:

When the average layer thickness of the upper layer formed of the (Al, Cr, Si, Cu)N layer is less than 0.5 µm, excellent wear resistance cannot be exhibited for a long-term usage. When the average layer thickness thereof exceeds 5.0 µm, chipping and fracturing are likely to occur. Therefore, the average layer thickness of the upper layer formed of the (Al, Cr, Si, Cu)N layer is set to 0.5 to 5.0 µm.

Crystal Structure of Upper Layer:

In the present invention, in order to achieve both the chipping resistance and excellent wear resistance of the hard coating layer under cutting work conditions under which high-temperature heat is generated and high impact and mechanical loads are exerted on a cutting edge, such as high-speed milling of a high hardness material like hardened steel, the composition and layer thickness of the upper layer formed of the (Al, Cr, Si, Cu)N layer are set as described above. However, in addition to this, the chipping resistance can be further improved by causing the crystal structure of the layer to be hexagonal.

Film formation of a hard coating using an AIP equipment is hitherto known. However, when film formation is performed using an Al—Cr—Si—Cu alloy as a target under typical conditions, an (Al, Cr, Si, Cu)N layer that is formed has a cubic structure or primarily has a cubic structure.

Here, in the present invention, when film formation is performed by an AIP equipment 6 using an Al—Cr—Si—Cu alloy shown in FIGS. 2A and 2B as a target, by performing the film formation in a magnetic field, controlling the maximum magnetic flux density applied to the surface of the target, and controlling a bias voltage, an (Al, Cr, Si, Cu)N layer composed of crystals having a hexagonal structure other than a cubic structure can be formed.

For example, by adjusting vapor deposition conditions to cause the maximum magnetic flux density applied to the surface of the target to be in a range of 7 to 15 mT (millitesla) and cause the bias voltage applied to the tool body to be in a range of −75 to −150 V, an (Al, Cr, Si, Cu)N layer composed of crystals having a hexagonal structure other than a cubic structure can be formed.

Since the crystal structure of the (Al, Cr, Si, Cu)N layer is the hexagonal structure, the toughness can be improved without the decrease in the wear resistance. As a result, the chipping resistance is improved.

The (Al, Cr, Si, Cu)N layer provided in the coated cutting tool of the present invention can be composed of crystals all having a hexagonal structure. However, even when crystals having a cubic structure are slightly contained in the layer, there is no adverse effect on chipping resistance and wear resistance.

However, when the diffraction peak intensity of a cubic (200) plane obtained by X-ray diffraction exceeds the diffraction peak intensity of a hexagonal (110) plane, while the wear resistance is improved, the chipping resistance decreases. Therefore, when it is assumed that the diffraction peak intensity of the cubic (200) plane is c(200) and the diffraction peak intensity of the hexagonal (110) plane is h(110), it is desirable that the peak intensity ratio satisfies c(200)/h(110)<1.

In a case where the peak intensity ratio is less than 0.05, for convenience, the peak intensity ratio is regarded as "0".

Hereinafter, both of the case where the entire crystal structure of the (Al, Cr, Si, Cu)N layer is a hexagonal structure and the case where crystals having a cubic structure are slightly contained in the (Al, Cr, Si, Cu)N layer are expressed as a case where the crystal structure of the (Al, Cr, Si, Cu)N layer primarily has a hexagonal structure.

When X-ray diffraction is performed on the upper layer formed of the (Al, Cr, Si, Cu)N layer provided in the coated cutting tool of the present invention, as shown in FIG. 3, a diffraction peak peculiar to the hexagonal structure from a (110) plane is observed when 2θ is in a range of 55° to 65°.

In a case where the diffraction peak is sharp, that is, in a case where the half width thereof is less than 1.0°, the wear resistance of the (Al, Cr, Si, Cu)N layer decreases. In a case where the peak is broad and the half width is more than 3.5°, there is a trend toward a reduction of the chipping resistance of the (Al, Cr, Si, Cu)N layer. Therefore, the half width of a diffraction peak of a (110) plane present in a range of 2θ=55° to 65° obtained by performing X-ray diffraction on the upper layer is 1.0° to 3.5°.

Average Total Layer Thickness of Intermediate Layer and Average Single Layer Thickness of Thin Layer A and Thin Layer B:

In the present invention, in order to improve the adhesion strength between the upper layer formed of the (Al, Cr, Si, Cu)N layer and the tool body, the lower layer formed of the (Al, Ti, Si)N layer is formed on the surface of the tool body. However, in order to further increase the adhesion strength between the upper layer formed of the (Al, Cr, Si, Cu)N layer and the lower layer formed of the (Al, Ti, Si)N layer, it is desirable to form the intermediate layer having the layer in which the thin layer A and the thin layer B are alternately stacked to be interposed between the upper layer and the lower layer.

The thin layer A is made of the (Al, Cr, Si, Cu)N layer having the same component composition as that of the upper layer, and the thin layer B is made of the (Al, Ti, Si)N layer having the same component composition as that of the lower layer.

When the average single layer thickness of each of the thin layer A and the thin layer B is less than 0.005 μm, it is difficult to clearly form each of the thin layers to have a predetermined composition, and the effect of improving the wear resistance by the thin layer A and the effect of improving the high-temperature toughness by the thin layer B are not sufficiently exhibited. In a case where the layer thickness of each of the thin layer A and the thin layer B exceeds 0.10 μm, defects of each of the thin layers, that is, the insufficiency of the strength of the thin layer A and the insufficiency of the wear resistance of the thin layer B occur in the layer, and there is concern that the decrease in the characteristics of the entire intermediate layer, and furthermore the entire hard coating layer may occur. Therefore, it is desirable that the average single layer thickness of each of the thin layer A and the thin layer B is set to 0.005 to 0.10 μm.

That is, the thin layer B is provided to compensate for insufficient characteristics of the characteristics of the thin layer A. However, when the layer thickness of each of the thin layer A and the thin layer B is in a range of 0.005 to 0.10 μm, the hard coating layer having the alternate laminated structure of the thin layer A and the thin layer B acts as a single layer having excellent high-temperature toughness and high-temperature strength without impairing excellent high-temperature hardness, high-temperature oxidation resistance, and heat-resistant plastic deformability, and further increases the adhesion strength between the upper layer and the lower layer. However, when the layer thickness of the thin layer A and the thin layer B exceeds 0.10 μm, the insufficiency of the strength of the thin layer A and the insufficiency of the wear resistance of the thin layer B become obvious.

In addition, the intermediate layer having the alternate laminated structure of the thin layer A and the thin layer B cannot exhibit excellent characteristics when the average total layer thickness thereof is less than 0.1 μm. When the average total layer thickness thereof exceeds 1.0 μm, chipping and fracturing are likely to occur. Therefore, the average total layer thickness of the intermediate layer having the alternate laminated structure of the thin layer A and the thin layer B is preferably set to 0.1 to 1.0 μm, and more desirably set to 0.2 to 0.5 μm.

Advantageous Effects of Invention

In the coated cutting tool of the present invention, the adhesion strength is increased by providing the lower layer formed of the (Al, Ti, Si)N layer between the upper layer formed of the (Al, Cr, Si, Cu)N layer and the tool body or the adhesion strength is further increased by forming the intermediate layer having the layer in which the thin layer A and the thin layer B are alternately stacked to be interposed between the upper layer and the lower layer, the upper layer is made of the (Al, Cr, Si, Cu)N layer primarily having the hexagonal structure, and in a case where X-ray diffraction is performed on the coating layer, the half width of the diffraction peak of the (110) plane present in a range of 2θ=55° to 65° is 1.0° to 3.5°, whereby the (Al, Cr, Si, Cu)N layer has excellent chipping resistance and wear resistance.

Therefore, even during high-speed milling of a high hardness material like hardened steel during which high-temperature heat is generated and high impact and mechanical loads are exerted on a cutting edge, the coated cutting tool of the present invention does not cause peeling and the like and exhibits excellent chipping resistance and wear resistance for a long-term usage.

DETAILED DESCRIPTION OF THE INVENTION

Next, the coated cutting tool of the present invention will be described in more detail with reference to examples.

In the examples, a case of using WC-based cemented carbide as a tool body is described. However, the examples are similarly applied to a case of using TiCN-based cermet, a cubic boron nitride sintered material, or high-speed tool steel as a tool body.

Example 1

As raw material powders, a medium coarse WC powder having an average particle diameter of 5.5 μm, a fine WC powder of 0.8 μm, a TaC powder of 1.3 μm, an NbC powder of 1.2 μm, a ZrC powder of 1.2 μm, a $Cr_3C_2$ powder of 2.3 μm, a VC powder of 1.5 μm, a (Ti,W)C [TiC/WC=50/50 in mass ratio] of 1.0 μm, and a Co powder of 1.8 μm were prepared, and the raw material powders were mixed in blending compositions shown in Table 1. Wax was further added thereto, and the mixture was blended in acetone by a ball mill for 24 hours and was decompressed and dried. Thereafter, the resultant was extruded and press-formed into various compacts having predetermined shapes at a pressure of 100 MPa, and the compacts were heated to a predetermined temperature in a range of 1370 to 1470° C. at a heating rate of 7° C./min in a vacuum atmosphere at 6 Pa, were held at this temperature for one hour, and were sintered under furnace cooling conditions, thereby forming round bar sintered materials for forming cutting tool bodies having a diameter of 10 mm. Furthermore, from the round bar sintered materials, by performing grinding, each of cutting tool bodies (end mills) 1 to 3 made of WC-based cemented carbide having a two-edge ball shape with a helix angle of 30 degrees in dimensions of 6 mm×12 mm as the diameter× the length of the cutting edge portion was produced.

Figure 1A:
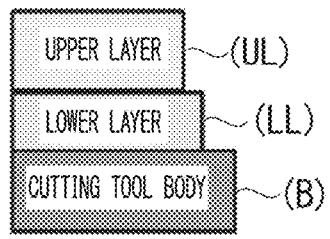
FIG. 1A illustrates a schematic longitudinal sectional view of a coated cutting tool of the present invention and illustrates a form of the coated cutting tool of the present invention.
Figure 1B:
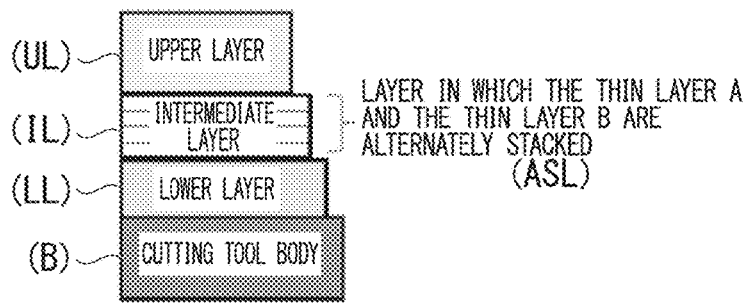
FIG. 1B illustrates a schematic longitudinal sectional view of the coated cutting tool of the present invention and illustrates another form of the coated cutting tool of the present invention.
Figure 2A:
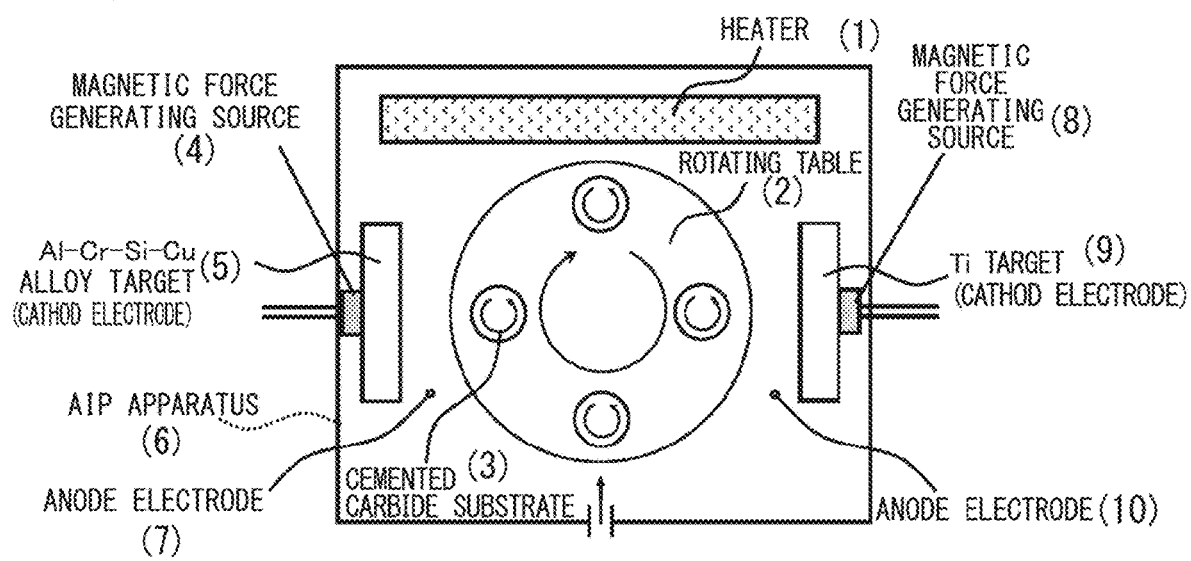
FIG. 2A is a schematic plan view of an arc ion plating apparatus used to form an (Al, Cr, Si, Cu)N layer provided in the coated cutting tool of the present invention.
Figure 2B:
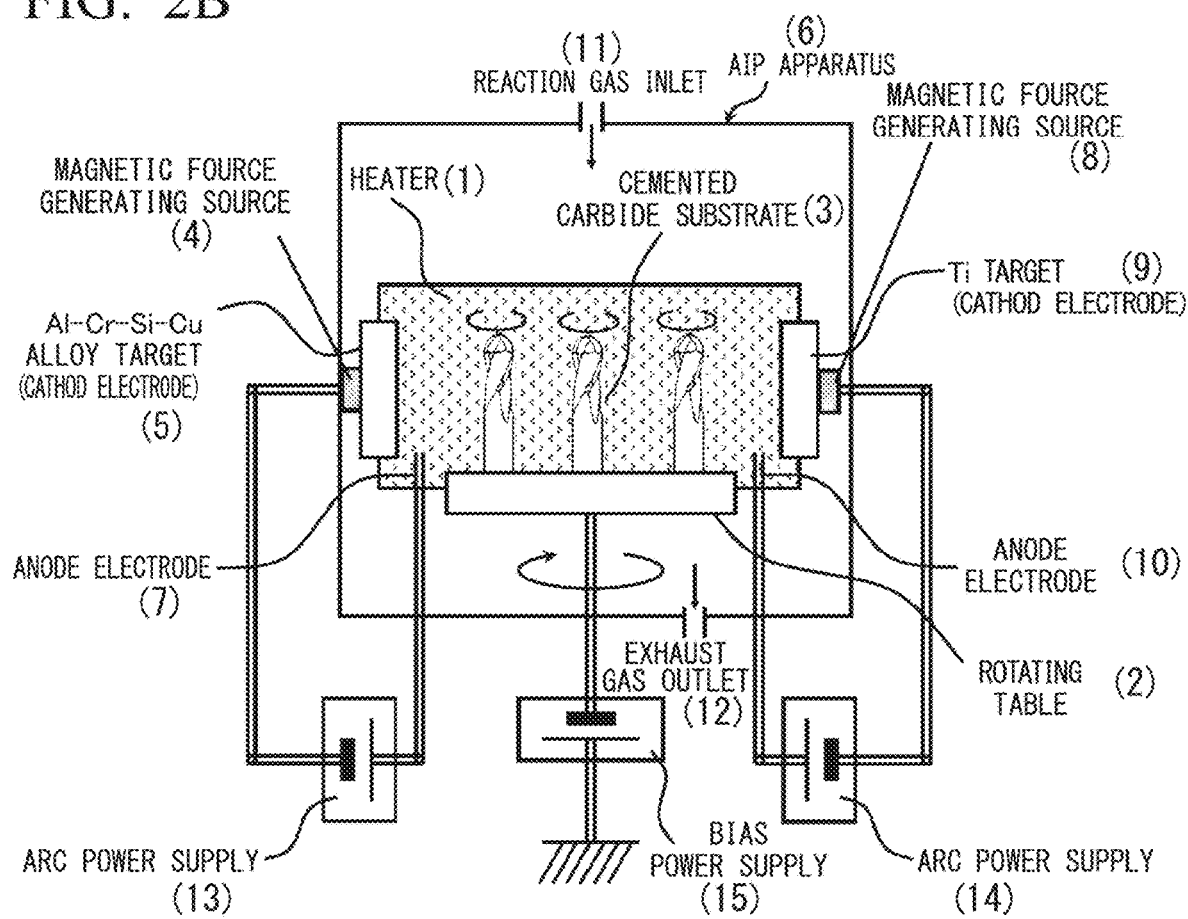
FIG. 2B is a schematic front view of the arc ion plating apparatus used to form the (Al, Cr, Si, Cu)N layer provided in the coated cutting tool of the present invention.
Figure 3:
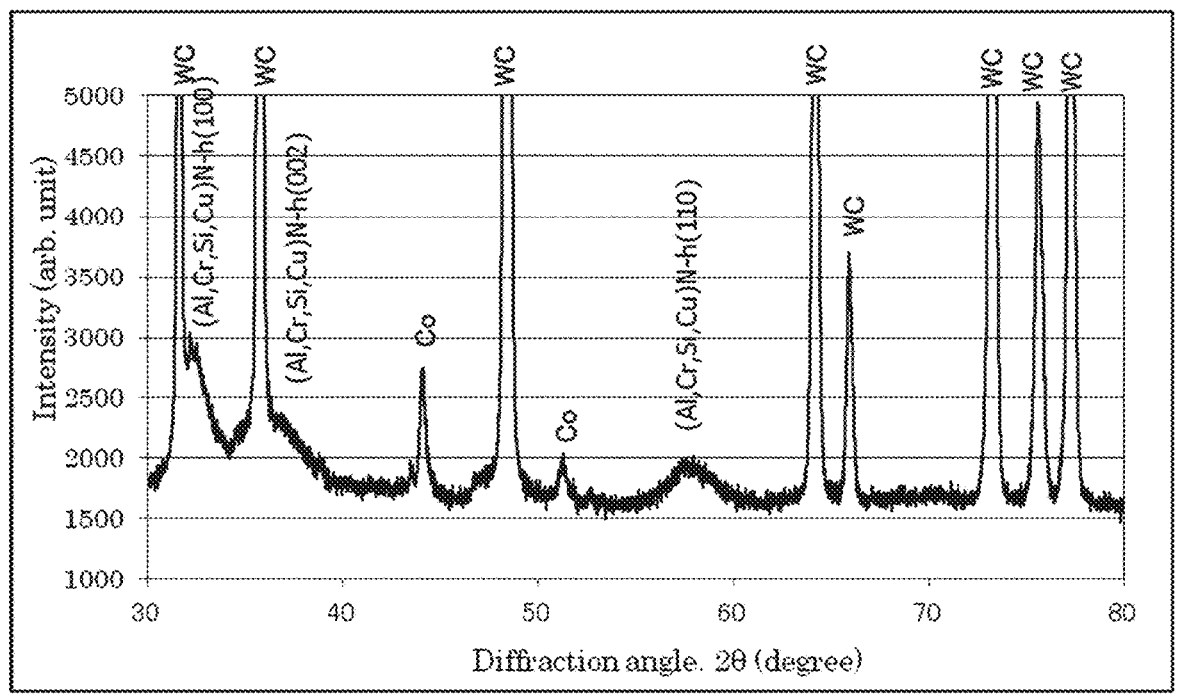
FIG. 3 is an example of an X-ray diffraction chart measured for the (Al, Cr, Si, Cu)N layer provided in the coated cutting tool of the present invention.

(a) The cutting tool bodies 1 to 3 mentioned above were subjected to ultrasonic cleaning in acetone and were dried, and in this state, were mounted at positions distant from the center axis on a rotating table 2 of the AIP equipment 6 shown in FIGS. 2A and 2B by predetermined distances in the radial direction along the outer circumferential portion, a target (cathode electrode) 9 made of an Al—Ti—Si alloy having a predetermined composition was disposed on one side of the AIP equipment 6, and a target (cathode electrode) 5 made of an Al—Cr—Si—Cu alloy having a predetermined composition was disposed on the other side.

(b) First, while the inside of the apparatus was evacuated and held in a vacuum, the tool body 3 was heated to 400° C. by a heater 1. Thereafter, a DC bias voltage of −1000 V was applied to the tool body 3 that was rotated while revolving on the rotating table 2 to cause a current of 100 A to flow between the Al—Ti—Si alloy cathode electrode 9 and an anode electrode 10 and generate arc discharge such that the surface of the tool body was subjected to bombardment cleaning.

(c) Next, nitrogen gas as a reaction gas was introduced into the apparatus to reach a nitrogen pressure shown in Table 2, the temperature of the tool body 3 which was rotated while revolving on the rotating table 2 was maintained in a temperature range shown in Table 2, a DC bias voltage shown in Table 2 was applied to cause a current of 100 A to flow between the Al—Ti—Si alloy target 9 and the anode electrode 10 and generate arc discharge, thereby depositing a lower layer LL formed of an (Al, Ti, Si)N layer having a composition and a target average layer thickness shown in Table 3 on the surface of the tool body 3.

(d) Next, a magnetic field controlled to various maximum magnetic flux densities shown in Table 2 was applied to the surface of the Al—Cr—Si—Cu alloy target, nitrogen gas as a reaction gas was introduced into the apparatus to reach a nitrogen pressure shown in Table 2, and while maintaining the temperature of the tool body 3 that was rotated while revolving on the rotating table 2 in a temperature range shown in Table 2, a DC bias voltage shown in Table 2 was applied to cause a current of 100 A to flow between the Al—Cr—Si—Cu alloy target 5 and an anode electrode 7 and generate arc discharge, thereby depositing a hard coating layer formed of an (Al, Cr, Si, Cu)N layer having a composition and a target average layer thickness shown in Table 3 on the surface of the tool body 3.

Accordingly, each of surface-coated end mills 1 to 10 (hereinafter, referred to as Present Inventions 1 to 10) as the coated cutting tool of the present invention shown in Table 3 was produced.

Example 2

The cutting tool bodies (end mills) 1 to 3 made of WC-based cemented carbide produced in Example 1 were subjected to ultrasonic cleaning in acetone and were dried, and in this state, were mounted at positions distant from the center axis on the rotating table of the AIP equipment shown in FIGS. 2A and 2B by predetermined distances in the radial direction along the outer circumferential portion, the target (cathode electrode) 9 made of the Al—Ti—Si alloy having the predetermined composition was disposed on one side of the AIP equipment 6, and the target (cathode electrode) 5 made of the Al—Cr—Si—Cu alloy having the predetermined composition was disposed on the other side.

(a) First, while the inside of the apparatus was evacuated and held in a vacuum, the tool body 3 was heated to 400° C. by the heater 1. Thereafter, a DC bias voltage of −1000 V was applied to the tool body 3 that was rotated while revolving on the rotating table 2 to cause a current of 100 A to flow between the Al—Ti—Si alloy cathode electrode 9 and anode electrode 10 and generate arc discharge such that the surface of the tool body was subjected to bombardment cleaning.

(b) Next, nitrogen gas as a reaction gas was introduced into the apparatus to reach a nitrogen pressure shown in Table 4, the temperature of the tool body 3 which was rotated while revolving on the rotating table 2 was maintained in a temperature range shown in Table 4, a DC bias voltage shown in Table 4 was applied to cause a current of 100 A to flow between the Al—Ti—Si alloy target 9 and the anode electrode 10 and generate arc discharge, thereby depositing a lower layer formed of an (Al, Ti, Si)N layer having a composition and a target average layer thickness shown in Table 5 on the surface of the tool body 3.

(c) Next, nitrogen gas as a reaction gas was introduced into the apparatus to reach a nitrogen pressure shown in Table 4, the temperature of the tool body 3 which was rotated while revolving on the rotating table 2 was maintained in a temperature range shown in Table 4, a DC bias voltage shown in Table 4 was applied to cause a current of 100 A to flow between the Al—Cr—Si—Cu alloy target 5 and the anode electrode 7 and generate arc discharge, thereby depositing a thin layer A formed of an (Al, Cr, Si, Cu)N layer having a composition and an average single layer thickness shown in Table 5 on the surface of the lower layer.

(d) Next, the arc discharge was stopped, a DC bias voltage shown in Table 4 was applied instead to cause a current of 100 A to similarly flow between the Al—Ti—Si alloy cathode electrode 9 and the anode electrode 10 and generate arc discharge, thereby depositing a thin layer B formed of an (Al, Ti, Si)N layer having a composition and an average single layer thickness shown in Table 5 on the surface of the thin layer A formed as described above.

(e) By alternately repeating (c) and (d) described above, an intermediate layer having an alternate laminated structure ASL of the thin layer A and the thin layer B was deposited until a predetermined average total layer thickness shown in Table 5 was reached.

(f) Next, a magnetic field controlled to various maximum magnetic flux densities shown in Table 4 was applied to the surface of the Al—Cr—Si—Cu alloy target 5, nitrogen gas as a reaction gas was introduced into the apparatus to reach a nitrogen pressure shown in Table 4, and while maintaining the temperature of the tool body 3 that was rotated while revolving on the rotating table 2 in a temperature range shown in Table 4, a DC bias voltage shown in Table 4 was applied to cause a current of 100 A to flow between the Al—Cr—Si—Cu alloy target 5 and the anode electrode 7 and generate arc discharge, thereby depositing a hard coating layer formed of an (Al, Cr, Si, Cu)N layer having a composition and a target average layer thickness shown in Table 5 on the surface of the tool body 3.

Accordingly, each of surface-coated end mills 11 to 20 (hereinafter, referred to as Present Inventions 11 to 20) as the coated cutting tool of the present invention shown in Table 5 was produced.

Comparative Example

For the purpose of comparison, the cutting tool bodies (end mills) 1 to 3 made of WC-based cemented carbide produced in Example 1 were subjected to ultrasonic cleaning in acetone and were dried, and in this state, were mounted at positions distant from the center axis on the rotating table 2 of the AIP equipment 6 shown in FIGS. 2A and 2B by predetermined distances in the radial direction along the outer circumferential portion, the target (cathode electrode) 9 made of the Al—Ti—Si alloy having the predetermined composition was disposed on one side of the AIP equipment 6, the target (cathode electrode) 5 made of the Al—Cr—Si—Cu alloy having the predetermined composition was disposed on the other side, and a lower layer LL, an intermediate layer IL, and an upper layer UL were formed under conditions shown in Table 6, whereby each of surface-coated end mills 1 to 10 (hereinafter, referred to as Comparative Examples 1 to 10) was produced as a comparative example coated tool shown in Table 7.

In Comparative Examples 1 and 2, film formation of the lower layer LL and the intermediate layer IL was not performed, and in Comparative Examples 3 to 6, film formation of the intermediate layer LL was not performed.

The compositions of the hard coating layers of Present Inventions 1 to 20 and Comparative Examples 1 to 10 produced as described above were measured by energy-dispersive X-ray spectroscopy (EDS) using a scanning electron microscope (SEM) or a transmission electron microscope (TEM).

The layer thicknesses thereof were measured in a cross-section using the scanning electron microscope and the transmission electron microscope, and the average layer thickness was calculated from the average value of the measured values at five points.

Furthermore, X-ray diffraction was performed on the (Al, Cr, Si, Cu)N layers of the hard coating layers in Present Inventions 1 to 20 and Comparative Examples 1 to 10 produced as described above, after background removal was performed, a peak of a (110) plane shown in a range of 2θ=55° to 65° representing a hexagonal structure was then fitted with a pseudo-Voigt function, and the half width of the peak was measured.

In addition, the X-ray diffraction measurement was performed by a 2θ-θ method using CuKα radiation with an X-ray diffractometer PANalytical Empyrean manufactured by Spectris., and the measurement was performed under measurement conditions of a measurement range (2θ) of 30 to 80 degrees, an X-ray output of 45 kV, 40 mA, a divergence slit of 0.5 degrees, a scan step of 0.013 degrees, and a measurement time per one step of 0.48 sec/step.

Tables 3, 5, and 7 show measured and calculated values.

TABLE 1

| Type | | Co | (Ti, W)C | TaC | NbC | ZrC | Cr$_3$C$_2$ | VC | WC | Diameter × length of cutting edge portion |
|---|---|---|---|---|---|---|---|---|---|---|
| Tool body | 1 | 5 | 5 | — | — | — | — | — | Medium coarse powder: balance | 6 × 12 |
| | 2 | 6 | — | 1 | 0.5 | — | — | — | Fine powder: balance | 6 × 12 |
| | 3 | 6 | — | 1 | — | 1 | 0.5 | 0.5 | Fine powder: balance | 6 × 12 |

TABLE 2

| | | | Film depositing conditions of lower layer | | | Film depositing conditions of upper layer | | | |
|---|---|---|---|---|---|---|---|---|---|
| Type | | Tool body symbol | Tool body temperature (° C.) | Nitrogen partial pressure (Pa) | Bias voltage (V) | Tool body temperature (° C.) | Nitrogen partial pressure (Pa) | Bias voltage (V) | Target surface maximum magnetic flux density (mT) |
| Present Invention | 1 | 1 | 500 | 2.6 | −50 | 500 | 9.3 | −75 | 13 |
| | 2 | 2 | 400 | 6.7 | −30 | 400 | 6.7 | −100 | 10 |
| | 3 | 3 | 450 | 4 | −50 | 450 | 4 | −100 | 10 |
| | 4 | 1 | 350 | 2.6 | −25 | 350 | 9.3 | −75 | 7 |
| | 5 | 2 | 500 | 4 | −30 | 500 | 6.7 | −100 | 13 |
| | 6 | 3 | 400 | 6.7 | −25 | 400 | 4 | −125 | 10 |
| | 7 | 1 | 450 | 2.6 | −50 | 450 | 6.7 | −100 | 7 |
| | 8 | 2 | 350 | 4 | −25 | 350 | 4 | −125 | 13 |
| | 9 | 3 | 400 | 6.7 | −50 | 400 | 6.7 | −75 | 10 |
| | 10 | 1 | 450 | 4 | −30 | 450 | 9.3 | −125 | 7 |

TABLE 3

| | | Lower layer | | | Upper layer | | | | |
|---|---|---|---|---|---|---|---|---|---|
| | | Composition (atomic ratio) | | Average layer thickness (μm) | Composition (atomic ratio) | | | Average layer thickness (μm) | Half width of h (110) |
| Type | | α value | β value | | a value | b value | c value | | | X-ray diffraction peak intensity ratio c (200)/h (110) |
| Present Invention | 1 | 0.38 | 0.03 | 0.3 | 0.40 | 0.20 | 0.005 | 1.5 | 3.4 | 0 |
| | 2 | 0.42 | 0.08 | 1.5 | 0.15 | 0.14 | 0.01 | 3.1 | 3.2 | 0 |
| | 3 | 0.38 | 0.05 | 0.5 | 0.17 | 0.10 | 0.02 | 2.0 | 2.5 | 0 |
| | 4 | 0.40 | 0.01 | 0.5 | 0.29 | 0.06 | 0.05 | 1.8 | 1.0 | 0 |
| | 5 | 0.39 | 0.04 | 0.3 | 0.32 | 0.08 | 0.03 | 2.6 | 2.2 | 0 |
| | 6 | 0.45 | 0.10 | 0.8 | 0.35 | 0.18 | 0.005 | 2.0 | 2.8 | 0 |
| | 7 | 0.30 | 0.01 | 3.0 | 0.17 | 0.12 | 0.01 | 5.0 | 3.0 | 0 |
| | 8 | 0.37 | 0.05 | 1.2 | 0.20 | 0.09 | 0.01 | 2.5 | 2.0 | 0.1 |
| | 9 | 0.45 | 0.08 | 2.0 | 0.28 | 0.05 | 0.05 | 3.3 | 1.7 | 0.4 |
| | 10 | 0.50 | 0.05 | 0.8 | 0.30 | 0.08 | 0.02 | 1.8 | 2.3 | 0.8 |

TABLE 4

| | | | Film depositing conditions | | | Film depositing conditions of intermediate layer | | | Film depositing conditions of upper layer | | | |
|---|---|---|---|---|---|---|---|---|---|---|---|---|
| Type | | Tool body symbol | Tool body temperature (° C.) | Nitrogen partial pressure (Pa) | Bias voltage (V) | Tool body temperature (° C.) | Nitrogen partial pressure (Pa) | Bias voltage (V) | Tool body temperature (° C.) | Nitrogen partial pressure (Pa) | Bias voltage (V) | Target surface maximum magnetic flux density (mT) |
| Present Invention | 11 | 2 | 500 | 2.6 | −50 | 500 | 4 | −50 | 500 | 9.3 | −75 | 13 |
| | 12 | 3 | 400 | 6.7 | −30 | 400 | 6.7 | −75 | 400 | 6.7 | −100 | 10 |
| | 13 | 1 | 450 | 4 | −50 | 450 | 4 | −50 | 450 | 4 | −100 | 10 |

TABLE 4-continued

| | | Film depositing conditions | | | Film depositing conditions of intermediate layer | | | Film depositing conditions of upper layer | | | Target surface |
|---|---|---|---|---|---|---|---|---|---|---|---|
| Type | Tool body symbol | Tool body temperature (° C.) | Nitrogen partial pressure (Pa) | Bias voltage (V) | Tool body temperature (° C.) | Nitrogen partial pressure (Pa) | Bias voltage (V) | Tool body temperature (° C.) | Nitrogen partial pressure (Pa) | Bias voltage (V) | maximum magnetic flux density (mT) |
| 14 | 2 | 350 | 2.6 | −25 | 350 | 9.3 | −50 | 350 | 9.3 | −75 | 7 |
| 15 | 3 | 500 | 4 | −30 | 500 | 6.7 | −50 | 500 | 6.7 | −100 | 13 |
| 16 | 1 | 400 | 6.7 | −25 | 400 | 4 | −75 | 400 | 4 | −125 | 10 |
| 17 | 2 | 450 | 2.6 | −50 | 450 | 4 | −75 | 450 | 6.7 | −100 | 7 |
| 18 | 3 | 350 | 4 | −25 | 350 | 4 | −50 | 350 | 4 | −125 | 13 |
| 19 | 1 | 400 | 6.7 | −50 | 400 | 6.7 | −25 | 400 | 6.7 | −75 | 10 |
| 20 | 2 | 450 | 4 | −30 | 450 | 9.3 | −50 | 450 | 9.3 | −125 | 7 |

TABLE 5

| | | Lower layer | | | Intermediate layer | | | | | | | |
|---|---|---|---|---|---|---|---|---|---|---|---|---|
| | | Composition (atomic ratio) | | Average layer thickness (μm) | Composition (atomic ratio) | | | Average single layer thickness of thin layer A (μm) | Composition (atomic ratio) | | Average single layer thickness of thin layer B (μm) | Average total layer thickness of intermediate layers (μm) |
| Type | | α value | β value | | a value | b value | c value | | α value | β value | | |
| Present Invention | 11 | 0.38 | 0.03 | 0.8 | 0.40 | 0.20 | 0.005 | 0.03 | 0.38 | 0.04 | 0.05 | 0.4 |
| | 12 | 0.42 | 0.08 | 3.0 | 0.15 | 0.14 | 0.01 | 0.10 | 0.42 | 0.08 | 0.10 | 1.0 |
| | 13 | 0.38 | 0.05 | 0.5 | 0.17 | 0.10 | 0.02 | 0.02 | 0.38 | 0.05 | 0.005 | 0.3 |
| | 14 | 0.40 | 0.01 | 1.0 | 0.29 | 0.06 | 0.05 | 0.05 | 0.40 | 0.01 | 0.08 | 0.5 |
| | 15 | 0.39 | 0.04 | 1.2 | 0.32 | 0.08 | 0.03 | 0.03 | 0.39 | 0.04 | 0.03 | 0.6 |
| | 16 | 0.45 | 0.10 | 0.3 | 0.35 | 0.18 | 0.005 | 0.005 | 0.45 | 0.10 | 0.005 | 0.1 |
| | 17 | 0.30 | 0.01 | 0.5 | 0.17 | 0.12 | 0.01 | 0.08 | 0.30 | 0.02 | 0.10 | 0.3 |
| | 18 | 0.37 | 0.05 | 2.0 | 0.20 | 0.09 | 0.01 | 0.02 | 0.35 | 0.04 | 0.05 | 1.0 |
| | 19 | 0.45 | 0.08 | 1.6 | 0.28 | 0.05 | 0.05 | 0.01 | 0.44 | 0.08 | 0.01 | 0.1 |
| | 20 | 0.50 | 0.05 | 1.0 | 0.30 | 0.08 | 0.02 | 0.05 | 0.50 | 0.05 | 0.03 | 0.5 |

| | | Upper layer | | | | | |
|---|---|---|---|---|---|---|---|
| | | Composition (atomic ratio) | | | Average layer thickness (μm) | Half width of h(110) | X-ray diffraction peak intensity ratio c(200)/h(110) |
| Type | | a value | b value | c value | | | |
| Present Invention | 11 | 0.40 | 0.20 | 0.005 | 1.5 | 3.4 | 0 |
| | 12 | 0.15 | 0.14 | 0.01 | 5.0 | 3.2 | 0 |
| | 13 | 0.17 | 0.10 | 0.02 | 2.0 | 2.5 | 0 |
| | 14 | 0.29 | 0.06 | 0.05 | 2.4 | 1.0 | 0 |
| | 15 | 0.32 | 0.08 | 0.03 | 3.0 | 2.2 | 0 |
| | 16 | 0.35 | 0.18 | 0.005 | 0.5 | 2.8 | 0 |
| | 17 | 0.17 | 0.12 | 0.01 | 2.2 | 3.0 | 0 |
| | 18 | 0.20 | 0.09 | 0.01 | 3.5 | 2.0 | 0.1 |
| | 19 | 0.28 | 0.05 | 0.05 | 1.8 | 1.7 | 0.4 |
| | 20 | 0.30 | 0.08 | 0.02 | 2.5 | 2.3 | 0.8 |

(Note 1)
"Half width of h(110)" is the half width of the diffraction peak of a (110) plane present in a range of 2θ = 55° to 65° obtained by X-ray diffraction.

TABLE 6

| Type | | Tool body symbol | Film depositing conditions | | | Film depositing conditions of intermediate layer | | | Film depositing conditions of upper layer | | | Target surface maximum magnetic flux density (mT) |
|---|---|---|---|---|---|---|---|---|---|---|---|---|
| | | | Tool body temperature (° C.) | Nitrogen partial pressure (Pa) | Bias voltage (V) | Tool body temperature (° C.) | Nitrogen partial pressure (Pa) | Bias voltage (V) | Tool body temperature (° C.) | Nitrogen partial pressure (Pa) | Bias voltage (V) | |
| Comparative Example | 1 | 1 | — | — | — | — | — | — | 400 | 4 | −25 | 5 |
| | 2 | 2 | — | — | — | — | — | — | 500 | 1.3 | −150 | 10 |
| | 3 | 3 | 350 | 4 | −50 | — | — | — | 350 | 9.3 | −25 | 1 |
| | 4 | 1 | 450 | 2.6 | −25 | — | — | — | 450 | 6.7 | −30 | 3.5 |
| | 5 | 2 | 400 | 4 | −30 | — | — | — | 400 | 4 | −50 | 5 |
| | 6 | 3 | 500 | 6.7 | −25 | — | — | — | 500 | 9.3 | −50 | 1 |
| | 7 | 1 | 350 | 2.6 | −50 | 350 | 4 | −25 | 350 | 6.7 | −30 | 3.5 |
| | 8 | 2 | 450 | 4 | −25 | 450 | 4 | −25 | 450 | 1.3 | −25 | 10 |
| | 9 | 3 | 400 | 6.7 | −50 | 400 | 6.7 | −30 | 400 | 6.7 | −50 | 5 |
| | 10 | 1 | 500 | 4 | −30 | 500 | 4 | −30 | 500 | 4 | −30 | 1 |

TABLE 7

| Type | | Lower layer | | | Intermediate layer | | | | | | | |
|---|---|---|---|---|---|---|---|---|---|---|---|---|
| | | Composition (atomic ratio) | | Average layer thickness (μm) | Composition (atomic ratio) | | | Average single layer thickness of thin layer A (μm) | Composition (atomic ratio) | | Average single layer thickness of thin layer B (μm) | Average total layer thickness of intermediate layers (μm) |
| | | α value | β value | | a value | b value | c value | | α value | β value | | |
| Comparative Example | 1 | — | — | — | — | — | — | — | — | — | — | — |
| | 2 | — | — | — | — | — | — | — | — | — | — | — |
| | 3 | 0.38 | 0.05 | 0.2* | — | — | — | — | — | — | — | — |
| | 4 | 0.25* | 0.01 | 1.0 | — | — | — | — | — | — | — | — |
| | 5 | 0.39 | 0.04 | 1.2 | — | — | — | — | — | — | — | — |
| | 6 | 0.45 | 0.15* | 0.3 | — | — | — | — | — | — | — | — |
| | 7 | 0.30 | 0.01 | 0.8 | 0.10* | 0.05 | 0.05 | 0.08 | 0.30 | 0.02 | 0.12* | 0.6 |
| | 8 | 0.37 | 0.05 | 2.0 | 0.40 | 0.25* | 0.005 | 0.08 | 0.35 | 0.04 | 0.05 | 1.5* |
| | 9 | 0.45 | 0.08 | 1.6 | 0.28 | 0.05 | 0.003* | 0.12* | 0.44 | 0.08 | 0.03 | 1.0 |
| | 10 | 0.55* | 0.05 | 0.8 | 0.32 | 0.08 | 0.03 | 0.01 | 0.55* | 0.05 | 0.01 | 0.3 |

| | | Upper layer | | | | | |
|---|---|---|---|---|---|---|---|
| | Type | Composition (atomic ratio) | | | Average layer thickness (μm) | Half width of h(110) | X-ray diffraction peak intensity ratio c(200)/h(110) |
| | | a value | b value | c value | | | |
| Comparative Example | 1 | 0.40 | 0.20 | 0.10* | 2.5 | 3.4 | 0 |
| | 2 | 0.15 | 0.14 | 0.01 | 5.2* | 5.5* | 0 |
| | 3 | 0.50* | 0.10 | 0.02 | 2.6 | 3.2 | 0 |
| | 4 | 0.28 | 0.05 | 0.05 | 1.5 | 1.8 | 0 |
| | 5 | 0.32 | 0.03* | 0.03 | 2.4 | 2.0 | 0 |
| | 6 | 0.17 | 0.10 | 0.02 | 1.8 | 0.8* | 0 |
| | 7 | 0.10* | 0.05 | 0.05 | 2.0 | 2.8 | 0 |
| | 8 | 0.40 | 0.25* | 0.005 | 3.6 | 3.2 | 0.2 |
| | 9 | 0.28 | 0.05 | 0.003* | 4 | 2.3 | 0.7 |
| | 10 | 0.32 | 0.08 | 0.03 | 0.3* | 1.9 | 0.6 |

(Note 1)
"Half width of h(110)" is the half width of the diffraction peak of a (110) plane present in a range of 2θ = 55° to 65° obtained by X-ray diffraction.

(Note 2)
Mark * in boxes indicates outside of the range of the present invention.

Next, the end mills of Present Inventions 1 to 20 and Comparative Examples 1 to 10 were subjected to a side face cutting test of alloy tool steel under the following conditions (referred to cutting condition A).

Work material—a plate material of JIS SKD11 (60HRC) having planar dimensions of 100 mm×250 mm and a thickness of 50 mm
    Cutting speed: 100 m/min
    Rotational speed: 5400 min.$^{-1}$
    Depth of cut: ae 0.25 mm, ap 2 mm
    Feed speed (per one edge): 0.04 mm/tooth
    Cutting length: 50 m Furthermore, a side face cutting test of high-speed tool steel was performed under the following conditions (referred to as cutting condition B).

Work material—a plate material of JIS SKH51 (64HRC) having planar dimensions of 100 mm×250 mm and a thickness of 50 mm
    Cutting speed: 100 m/min
    Rotational speed: 5400 min.$^{-1}$
    Depth of cut: ae 0.2 mm, ap 2.5 mm
    Feed speed (per one edge): 0.05 mm/tooth
    Cutting length: 15 m The wear width of the flank face of a cutting edge in any of the side face cutting tests was measured.

The measurement results are shown in Table 8.

the (Al, Cr, Si, Cu)N layer or the half width of the diffraction peak of the (110) plane deviates the range specified in the present invention, it is obvious that the service life is reached within a relatively short period of time due to the occurrence of chipping or peeling or wear progression.

In addition, the results shown in Table 8 are applied to the coated cutting tool of the present invention in which the WC-based cemented carbide is used as the tool body. However, the tool body is not limited to the WC-based cemented carbide, and a TiCN-based cermet, a cubic boron nitride sintered material, or high-speed tool steel can be used as the tool body, and in a coated cutting tool of the present invention using this as the tool body, excellent chipping resistance and excellent wear resistance are exhibited for a long-term usage as in the above-described examples.

INDUSTRIAL APPLICABILITY

As described above, the coated cutting tool of the present invention exhibits excellent cutting performance for a long-term usage in a case of being provided for high-speed milling of a high hardness material like hardened steel. Therefore, the coated cutting tool of the present invention can satisfactorily cope with the factory automation of cutting apparatuses, power saving and energy saving during cutting work, and a further reduction of costs.

TABLE 8

| Type | | Wear width of flank face (mm) | | Type | | Wear width of flank face (mm) | | Type | | Wear width of flank face (mm) | |
| --- | --- | --- | --- | --- | --- | --- | --- | --- | --- | --- | --- |
| | | Cutting condition (A) | Cutting condition (B) | | | Cutting condition (A) | Cutting condition (B) | | | Cutting condition (A) | Cutting condition (B) |
| Present Invention | 1 | 0.10 | 0.08 | Present Invention | 11 | 0.07 | 0.07 | Comparative Example | 1 | 0.18 | 0.19 |
| | 2 | 0.06 | 0.06 | | 12 | 0.05 | 0.04 | | 2 | 35 m* | 7 m* |
| | 3 | 0.05 | 0.05 | | 13 | 0.03 | 0.05 | | 3 | 0.16 | 0.19 |
| | 4 | 0.07 | 0.10 | | 14 | 0.08 | 0.08 | | 4 | 30 m* | 0.17* |
| | 5 | 0.06 | 0.06 | | 15 | 0.04 | 0.05 | | 5 | 0.15 | 10 m* |
| | 6 | 0.11 | 0.08 | | 16 | 0.07 | 0.07 | | 6 | 0.19 | 0.20 |
| | 7 | 0.09 | 0.07 | | 17 | 0.06 | 0.05 | | 7 | 43 m* | 0.18 |
| | 8 | 0.10 | 0.08 | | 18 | 0.09 | 0.06 | | 8 | 0.17 | 0.18 |
| | 9 | 0.06 | 0.05 | | 19 | 0.05 | 0.04 | | 9 | 0.18 | 12 m* |
| | 10 | 0.08 | 0.10 | | 20 | 0.08 | 0.08 | | 10 | 45 m* | 0.20 |

(in the table, mark "*" in boxes of the comparative examples is a cutting length (m) until the service life (wear width of flank face 0.2 mm) is reached due to chipping or wear)

From the results shown in Table 8, in the coated cutting tool of the present invention, the hard coating layer includes the lower layer and the intermediate layer having a predetermined composition and an average layer thickness and includes the upper layer formed of the (Al, Cr, Si, Cu)N layer having a predetermined composition and an average layer thickness, the crystals of the upper layer primarily have a hexagonal structure, and furthermore, in a case where X-ray diffraction is performed on the upper layer, the half width of the diffraction peak of the (110) plane present in a range of 2θ=55° to 65° is 1.0° to 3.5°, whereby excellent chipping resistance, peeling resistance, and wear resistance are exhibited during cutting work of a high hardness material like hardened steel and excellent cutting performance is exhibited for a long-term usage.

Contrary to this, in the comparative example coated tool in which the hard coating layer does not include the lower layer and the intermediate layer having a predetermined composition and an average layer thickness or the composition and the crystal structure of the upper layer formed of

REFERENCE SIGNS LIST

B: Tool body
LL: Lower layer
UL: Upper layer
ASL: Alternate laminate of the thin layer A and the thin layer B
1: Heater
2: Rotating table
3: Cemented carbide substrate
4, 8: Magnetic force generating source
5: Al—Cr—Si—Cu alloy target (cathode electrode)
6: AIP equipment
7, 10: Anode electrode
9: Al—Ti—Si target (cathode electrode)
11: Reactive gas inlet
12: Exhaust gas outlet
13, 14: Arc electrode
15: Bias electrode

What is claimed is:

1. A surface-coated cutting tool comprising:
   a tool body made of any one selected from the group consisting of tungsten carbide-based cemented carbide, TiCN-based cermet, a cubic boron nitride sintered material, and high-speed tool steel; and
   a hard coating layer, which is provided on a surface of the tool body and includes at least a lower layer and an upper layer, wherein
   (a) the lower layer is made of a complex nitride layer of Al, Ti, and Si with an average layer thickness of 0.3 to 3.0 μm, and in a case where the lower layer is expressed by a composition formula: $(Al_{1-\alpha-\beta}Ti_\alpha Si_\beta)N$,
   the lower layer satisfies $0.3 \leq \alpha \leq 0.5$ and $0.01 \leq \beta \leq 0.10$ (here, each of $\alpha$ and $\beta$ is in atomic ratio),
   (b) the upper layer is made of a complex nitride layer of Al, Cr, Si, and Cu with an average layer thickness of 0.5 to 5.0 μm, and in a case where the upper layer is expressed by a composition formula: $(Al_{1-a-b-c}Cr_a Si_b Cu_c)N$,
   the upper layer satisfies $0.15 \leq a \leq 0.40$, $0.05 \leq b \leq 0.20$, and $0.005 \leq c \leq 0.05$ (here, each of a, b, and c is in atomic ratio), and
   (c) the upper layer is made of crystals having a hexagonal structure, and a half width of a diffraction peak of a (110) plane present in a range of $2\theta = 55°$ to $65°$ obtained by performing X-ray diffraction on the upper layer is $1.0°$ to $3.5°$.

2. The surface-coated cutting tool according to claim 1, wherein
   an intermediate layer which has an alternate laminated structure of a thin layer A and a thin layer B and has an average total layer thickness of 0.1 to 1.0 μm is formed to be interposed between the lower layer and the upper layer,
   (a) in a case where the thin layer A is expressed by a composition formula: $(Al_{1-a-b-c}Cr_a Si_b Cu_c)N$,
   the thin layer A satisfies $0.15 \leq a \leq 0.40$, $0.05 \leq b \leq 0.20$, $0.005 \leq c \leq 0.05$ (here, each of a, b, and c is in atomic ratio) and is made of a complex nitride layer of Al, Cr, Si, and Cu with an average single layer thickness of 0.005 to 0.10 μm, and
   (b) in a case where the thin layer B is expressed by a composition formula: $(Al_{1-\alpha-\beta}Ti_\alpha Si_\beta)N$,
   the thin layer B satisfies $0.30 \leq \alpha \leq 0.50$, $0.01 \leq \beta \leq 0.10$ (here, each of $\alpha$ and $\beta$ is in atomic ratio) and is made of a complex nitride layer of Al, Ti, and Si with an average single layer thickness of 0.005 to 0.10 μm.

3. The surface-coated cutting tool according to claim 1, wherein the upper layer contains crystals of a cubic structure with crystals of the hexagonal structure in the layer.

4. The surface-coated cutting tool according to claim 1, wherein, when it is defined that a diffraction peak intensity of a cubic (200) plane of the upper layer is c(200) and a diffraction peak intensity of a hexagonal (110) plane of the upper layer is h(110), a peak intensity ratio satisfies $c(200)/h(110) < 1$.

5. The surface-coated cutting tool according to claim 2, wherein the upper layer contains crystals of a cubic structure with crystals of the hexagonal structure in the layer.

6. The surface-coated cutting tool according to claim 2, wherein, when it is defined that a diffraction peak intensity of a cubic (200) plane of the upper layer is c(200) and a diffraction peak intensity of a hexagonal (110) plane of the upper layer is h(110), a peak intensity ratio satisfies $c(200)/h(110) < 1$.

7. The surface-coated cutting tool according to claim 3, wherein, when it is defined that a diffraction peak intensity of a cubic (200) plane of the upper layer is c(200) and a diffraction peak intensity of a hexagonal (110) of the upper layer plane is h(110), a peak intensity ratio satisfies $c(200)/h(110) < 1$.

8. The surface-coated cutting tool according to claim 5, wherein, when it is defined that a diffraction peak intensity of a cubic (200) plane of the upper layer is c(200) and a diffraction peak intensity of a hexagonal (110) plane of the upper layer is h(110), a peak intensity ratio satisfies $c(200)/h(110) < 1$.

* * * * *